United States Patent
Cho et al.

(10) Patent No.: US 8,110,829 B2
(45) Date of Patent: Feb. 7, 2012

(54) ARRAY SUBSTRATE OF LIQUID CRYSTAL DISPLAY AND METHOD FOR FABRICATING THE SAME

(75) Inventors: Yong Soo Cho, Daegu (KR); Chan Ki Ha, Incheon (KR); Byoung Ho Lim, Gyeongsangbuk-Do (KR); Cheol Se Kim, Daegu (KR); Kyo Ho Moon, Daegu (KR); Kwang Sik Oh, Gyeongsangbuk-Do (KR); Eung Do Kim, Gyeongsangbuk-Do (KR); Jae Hyung Jo, Busan (KR); Min Jae Lee, Daegu (KR)

(73) Assignee: LG Display Co., Ltd., Seoul (KR)

( * ) Notice: Subject to any disclaimer, the term of this patent is extended or adjusted under 35 U.S.C. 154(b) by 347 days.

(21) Appl. No.: 12/318,460

(22) Filed: Dec. 30, 2008

(65) Prior Publication Data
US 2009/0166630 A1 Jul. 2, 2009

(30) Foreign Application Priority Data
Dec. 31, 2007 (KR) .................. 10-2007-0141958

(51) Int. Cl.
*H01L 29/04* (2006.01)
(52) U.S. Cl. ............ 257/52; 257/57; 257/66; 257/290; 257/E33.004
(58) Field of Classification Search ............... 257/52, 257/57, 66, 290
See application file for complete search history.

(56) References Cited

U.S. PATENT DOCUMENTS

| | | | | |
|---|---|---|---|---|
| 5,539,551 | A | * | 7/1996 | Nomoto et al. ............ 349/42 |
| 5,917,199 | A | | 6/1999 | Byun et al. |
| 6,211,533 | B1 | | 4/2001 | Byun et al. |
| 7,229,862 | B2 | * | 6/2007 | Yamazaki et al. ........ 438/151 |
| 2002/0106825 | A1 | * | 8/2002 | Lee et al. .................. 438/30 |
| 2009/0159940 | A1 | * | 6/2009 | Sambandan et al. ..... 257/292 |

FOREIGN PATENT DOCUMENTS

| | | |
|---|---|---|
| KR | 10-1989-0007752 | 6/1989 |
| KR | 10-2002-0077483 | 10/2002 |
| KR | 10-2005-0117846 | 12/2005 |

* cited by examiner

*Primary Examiner* — Wai Sing Louie
(74) *Attorney, Agent, or Firm* — Morgan, Lewis & Bockius LLP

(57) ABSTRACT

A thin film transistor (TFT) for a liquid crystal display device includes a gate electrode, a source electrode, a drain electrode, an active region including a first semiconductor layer and a second semiconductor layer interposed within the first semiconductor layer, and an ohmic contact layer formed on the active region, wherein the source and drain electrodes are formed on the ohmic contact layer.

11 Claims, 16 Drawing Sheets

ARRAY SUBSTRATE OF LIQUID CRYSTAL DISPLAY AND METHOD FOR FABRICATING THE SAME

This application claims the benefit of the Korean Patent Application No. 10-2007-0141958 filed on Dec. 31, 2007, which is hereby incorporated by reference.

BACKGROUND OF THE INVENTION

1. Field of the Invention

The present invention relates to an array substrate for a liquid crystal display (LCD) and its fabrication method, and more particularly, to an array substrate for an LCD and its fabrication method capable of improving electrical characteristics of thin film transistors by improving ON-current and electric charge mobility.

2. Discussion of the Related Art

As the consumer interest in information displays is growing and the demand for portable (mobile) information devices is increasing, research and commercialization of light and thin flat panel displays ("FPD") have increased. Among FPDs, the liquid crystal display ("LCD") is a device for displaying images by using optical anisotropy of liquid crystals. LCD devices exhibit excellent resolution, color, and picture quality. As a result, LCD devices are widely used in notebook computers, desktop monitors, and the like.

The LCD includes a color filter substrate, an array substrate, and a liquid crystal layer formed between the color filter substrate and the array substrate. The general structure of the LCD according to the related art will now be described in detail with reference to FIG. 1.

FIG. 1 is an exploded perspective view showing a general LCD according to the related art. As shown in FIG. 1, the LCD includes a color filter substrate 5, an array substrate 10, and a liquid crystal layer 30 formed between the color filter substrate 5 and the array substrate 10. The color filter substrate 5 includes a color filter (C) including a plurality of sub-color filters 7 that implement red, green, and blue colors, a black matrix 6 for dividing the sub-color filters 7 and blocking light transmission through the liquid crystal layer 30, and a transparent common electrode 8 for applying voltage to the liquid crystal layer 30. The array substrate 10 includes gate lines 16 and data lines 17 which are arranged horizontally and vertically, respectively to define a plurality of pixel regions (P), TFTs, or switching elements, formed at respective crossings of the gate lines 16 and the data lines 17, and pixel electrodes 18 formed on the pixel regions (P). The color filter substrate 5 and the array substrate 10 are attached in a facing manner by a sealant (not shown) formed at an edge of an image display region to form a liquid crystal panel, and the color filter substrate 5 and the array substrate 10 are attached to each other by an attachment key formed on the color filter substrate 5 or the array substrate 10.

In the fabricating process of the LCD, a plurality of masking processes (e.g., photographing processes) are performed to fabricate the array substrate including the TFTs, so a method for reducing the number of masks is required to improve productivity.

FIGS. 2A to 2E are sectional views sequentially showing a fabrication process of the array substrate of the LCD in FIG. 1 according to the related art. As shown in FIG. 2A, a gate electrode 21 made of a conductive material is formed by using a photolithography process (e.g., a first masking process) on a substrate. Next, as shown in 2B, a first insulation film 15a, an amorphous silicon thin film, and an n+ amorphous silicon thin film are sequentially deposited on the entire surface of the substrate 10 with the gate electrode 21 formed thereon, and the amorphous silicon thin film and the n+ amorphous silicon thin film are selectively patterned by using the photolithography process (e.g., a second masking process) to form an active pattern 24 formed of the amorphous silicon thin film on the gate electrode 21. In this case, the n+ amorphous silicon thin film pattern 25, which has been patterned in the same form as the active pattern 24, is formed on the active pattern 24.

Thereafter, as shown in FIG. 2C, a conductive metal material is deposited on the entire surface of the array substrate 10 and then selectively patterned by using the photolithography process (e.g., a third masking process) to form a source electrode 22 and a drain electrode 23 at an upper portion of the active pattern 24. At this time; a certain portion of the n+ amorphous silicon thin film pattern formed on the active pattern 24 is removed through the third masking process to form an ohmic-contact layer 25n between the active pattern 24 and the source and drain electrodes 22 and 23.

Subsequently, as shown in FIG. 2D, a passivation layer 15b is deposited on the entire surface of the array substrate 10 with the source electrode 22 and the drain electrode 23 formed thereon, and a portion of the passivation layer 15b is removed through the photolithography process (e.g., a fourth masking process) to form a contact hole 40 exposing a portion of the drain electrode 23. Finally, as shown in FIG. 2E, a transparent conductive metal material is deposited on the entire surface of the array substrate 10 and then selectively patterned by using the photolithography process (e.g., a fifth making process) to form a pixel electrode 18 electrically connected with the drain electrode 23 via the contact hole 40.

As mentioned above, in fabricating the array substrate including the TFTs, five photolithography process are necessarily performed to pattern the gate electrode, the active layer, the source and drain electrodes, the contact hole, and the pixel electrode. The photolithography process is a process of transferring a pattern formed on a mask onto the substrate on which a thin film is deposited to form a desired pattern, which includes a plurality of processes such as a process of coating a photosensitive solution, an exposing process, a developing process, etc. The plurality of photolithography processes degrade production yield.

FIG. 3 is a sectional view schematically showing the structure of a general thin film transistor according to the related art. With reference to FIG. 3, after the active layer 24 is deposited, a channel part is formed through a back channel etch, namely, an etching process. In this case, current flows through the metal electrode of the source electrode 22, the ohmic-contact layer 25n, the channel layer of the active layer 24, the ohmic-contact layer 25n, and then to the metal electrode of the drain electrode 23 (A→B→C→D). In this case, there is an electrical barrier between the channel layer of the active layer 24 and the ohmic-contact layer 25n (A~B, C~D), interfering with the flow of electrons and increasing resistance. Reference letter "d" indicates the depth of the etched portion, and "Vs," "Vd," and "Vg" indicate a source voltage, a drain voltage, and a gate voltage, respectively.

Thus, linear electron mobility of the TFTs is reduced due to a vertical serial resistance at the linear region. In addition, the active layer has intrinsic characteristics, such as a Vth value, namely, a threshold voltage ranging from 1V to 2V causing a problem that when the panel is driven, the gate voltage should be applied according to the threshold voltage Vth to activate the TFT. However, there is no technique for moving the threshold voltage Vth value.

SUMMARY OF THE INVENTION

Accordingly, the present invention is directed to an array substrate of liquid crystal display and a method for fabricating the same that substantially obviates one or more problems due to limitations and disadvantages of the related art.

An object of the present invention is to provide a provide an array substrate for a liquid crystal display (LCD) and a fabrication method capable of improving an ON-current and charge mobility of thin film transistors (TFTs) by reducing resistance between a channel layer of an active layer and an ohmic-contact layer.

Another object of the present invention is to provide an array substrate for an LCD and a fabrication method capable of accomplishing RF driving by improving charge mobility that affects charging characteristics.

Another object of the present invention is to provide an array substrate for an LCD and a fabrication method capable of controlling a threshold voltage of TFTs.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, a thin film transistor (TFT) for a liquid crystal display device includes a gate electrode, a source electrode, a drain electrode, an active region including a first semiconductor layer and a second semiconductor layer interposed within the first semiconductor layer, and an ohmic contact layer formed on the active region, wherein the source and drain electrodes are formed on the ohmic contact layer.

In another aspect, a thin film transistor (TFT) for a liquid crystal display device includes a gate electrode, a gate insulating layer over the gate electrode, a first semiconductor layer formed on the gate insulation layer, a second semiconductor layer formed on the first semiconductor layer, an etched portion formed in the first and second semiconductor layers, an ohmic contact layer formed on the second semiconductor layer, and source and drain electrodes formed on the ohmic contact layer.

In yet another aspect, a thin film transistor (TFT) for a liquid crystal display device includes a gate electrode, a gate insulating layer formed on the gate electrode, a first active layer formed on the gate electrode, an n– amorphous silicon layer formed on the first active layer, a second active layer formed on the n– amorphous silicon layer, an ohmic contact layer formed on the second active layer, and source and drain electrodes formed on the ohmic contact layer.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE EMBODIMENTS

Reference will now be made in detail to the embodiments of the present invention, examples of which are illustrated in the accompanying drawings.

Figure 1:
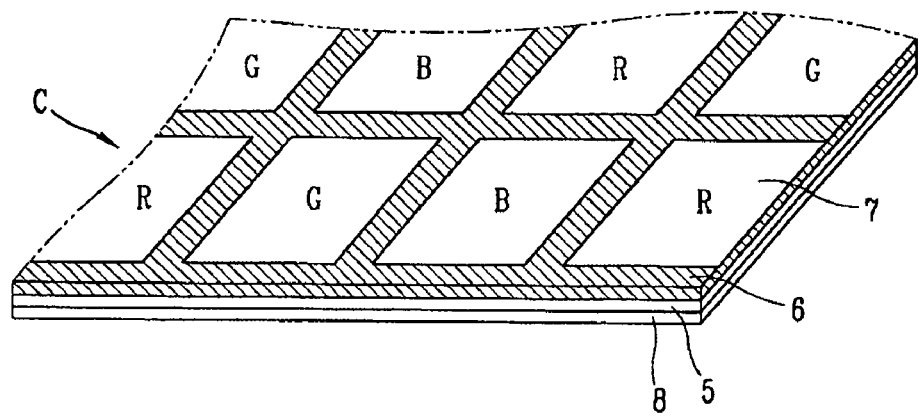
FIG. 1 is an exploded perspective view schematically showing a general liquid crystal display according to the related art.
Figure 1:
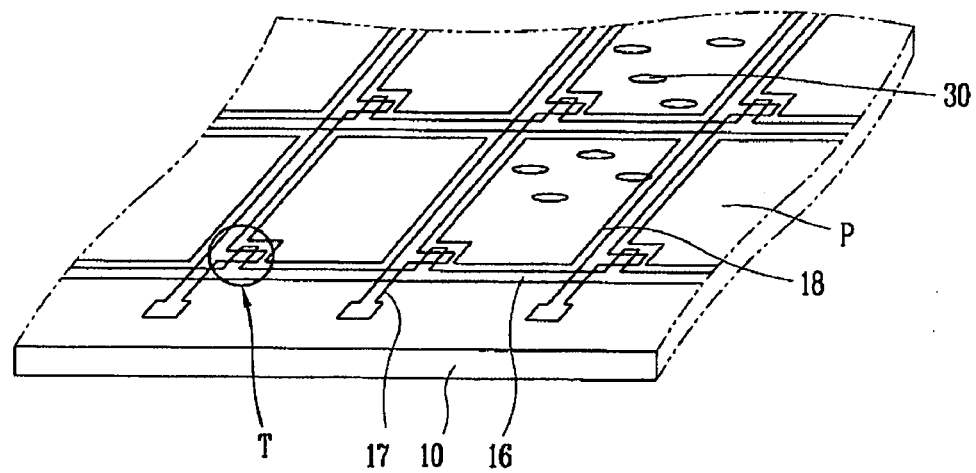
Figure 2A:
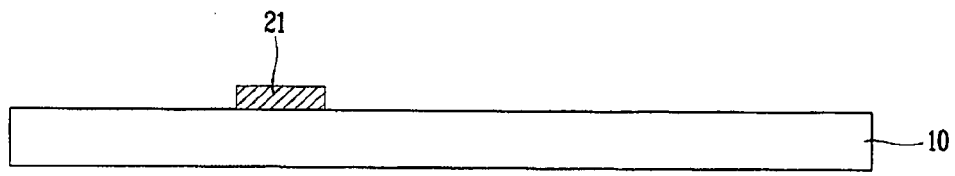
FIGS. 2A to 2E are sectional views sequentially showing a fabrication process of an array substrate of the LCD in FIG. 1 according to the related art.
Figure 2B:
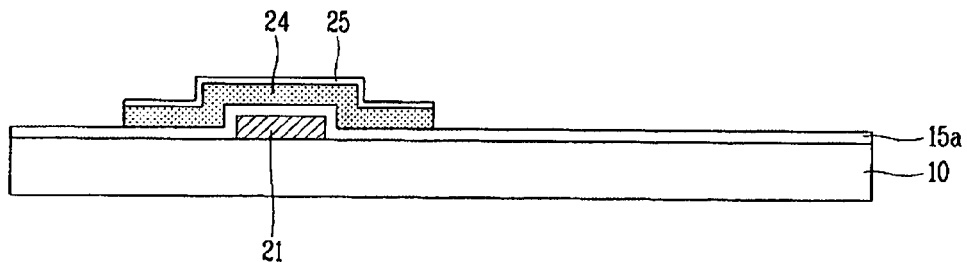
Figure 2C:
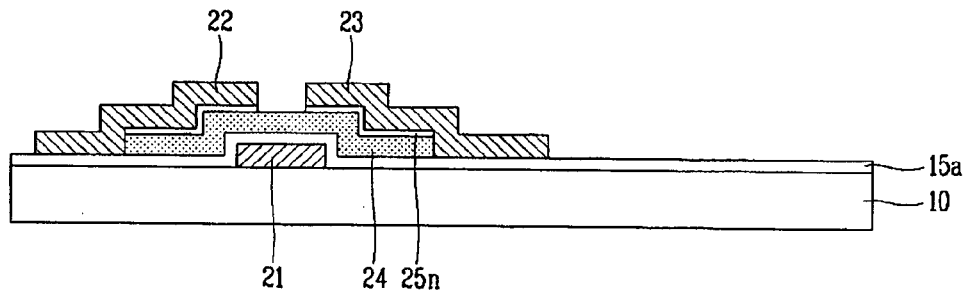
Figure 2D:
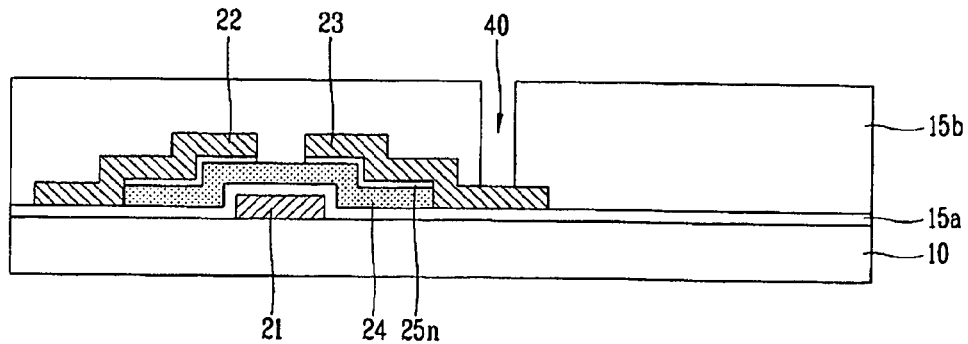
Figure 2E:
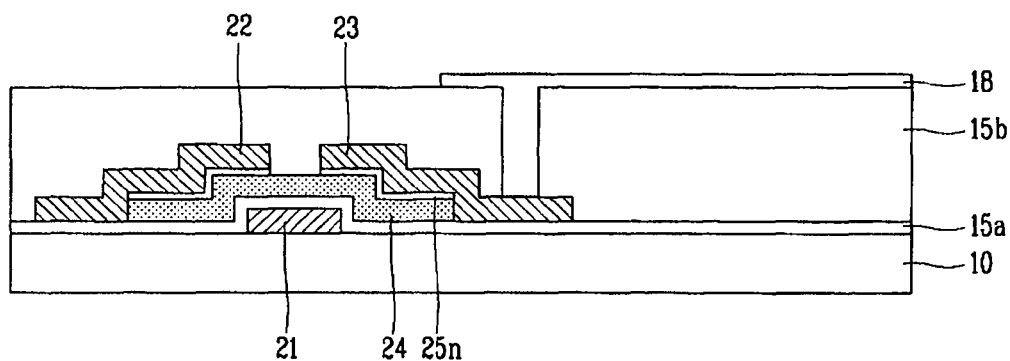
Figure 3:
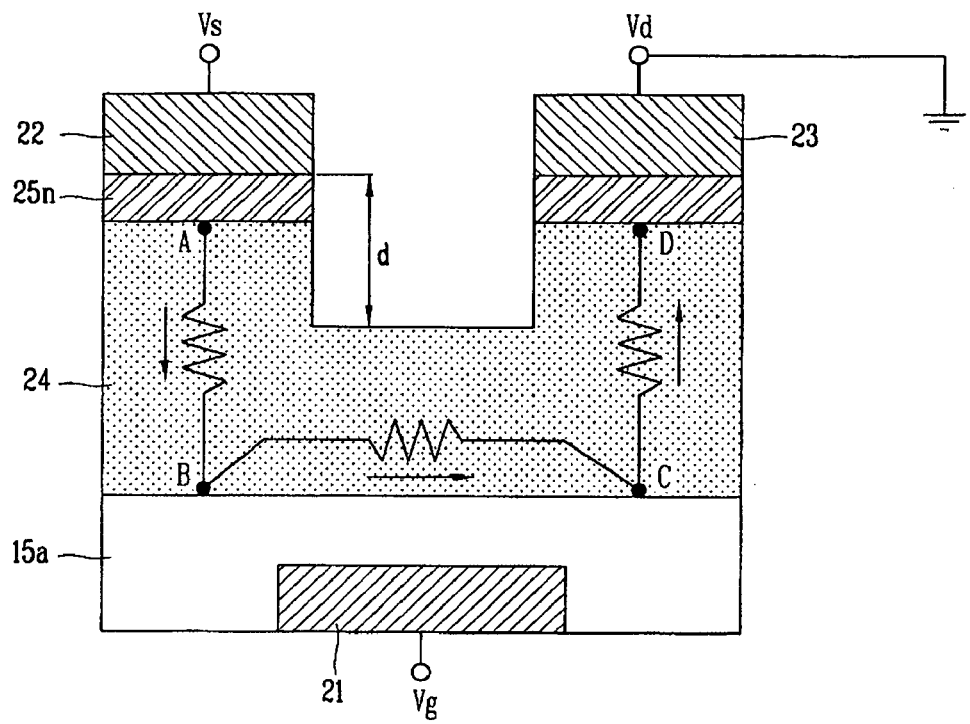
FIG. 3 is a sectional view schematically showing the structure of a general thin film transistor according to the related art.
Figure 4:
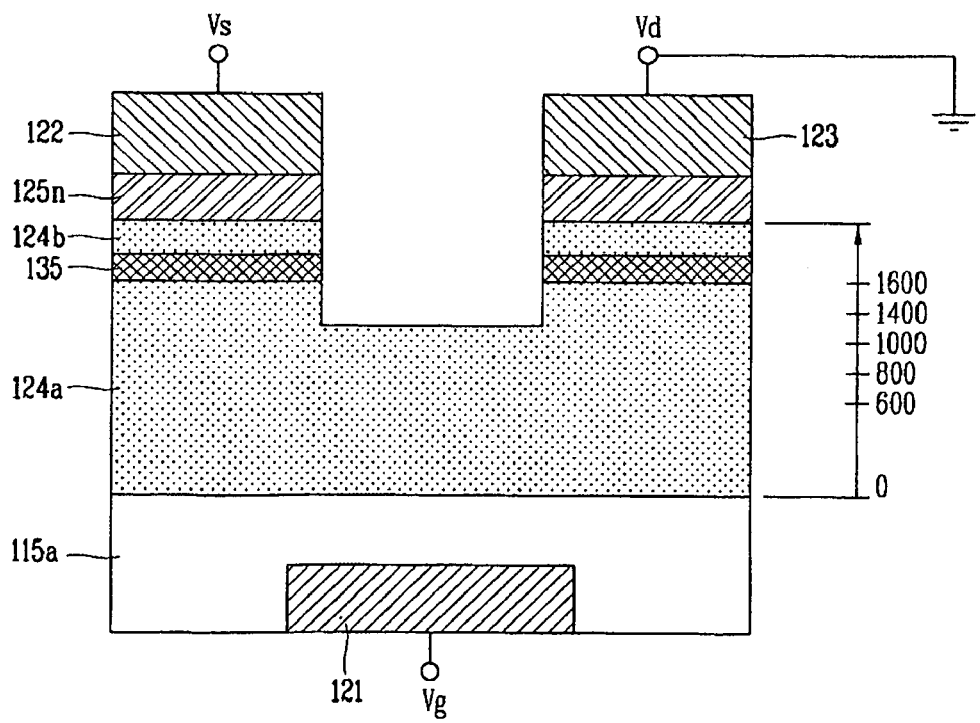
FIG. 4 is a sectional view schematically showing the structure of a TFT according to a first embodiment of the present invention.

FIG. 4 is a sectional view schematically showing a structure of a thin film transistor (TFT) according to a first embodiment of the present invention. As shown in FIG. 4, a TFT according to a first embodiment of the present invention is formed such that, on a gate electrode 121, there are sequentially formed a first active layer 124a formed on a first amorphous silicon thin film with a gate insulating layer 115a interposed therebetween, an n– layer 135 formed of an n– amorphous silicon thin film, a second active layer 124b formed of a second amorphous silicon thin film, and an ohmic-contact layer 125n formed of an n+ amorphous silicon thin film. A source electrode 122 and a drain electrode 123 are formed on the ohmic-contact layer 125n and in ohmic-contact with the second active layer 124b via the ohmic-contact layer 125n.

The active layer according to the first embodiment of the present invention includes the first active layer 124a and the second active layer 124b formed with the n– layer 135 interposed therebetween, and when etching is performed to form a channel layer, the first active layer 124a is etched up to a certain thickness. Because the local n– layer 135 is formed in the active layer, a serial resistance between the source and drain electrodes 122 and 123 and the channel layer can be reduced to increase conductivity. As a result, ON current and electron mobility can be improved, and accordingly, the electrical characteristics of the TFT can be enhanced.

In the first embodiment of the present invention, the n– amorphous silicon thin film is formed by injecting $PH_3$ gas to a region about 100 Å to about 300 Å from an n+ amorphous silicon thin film. In this case, it can be deposited successively together with the first and second amorphous silicon thin films, or after the first amorphous silicon thin film is formed, the n– amorphous silicon thin film may be formed by performing additional $PH_3$ plasma processing. In this case, formation of the n− amorphous silicon thin film by successively depositing $PH_3$ is advantageous because there is no tack time loss.

Here, in the LCD according to the first embodiment of the present invention, the active layer, the source electrode, and the drain electrode are formed through a single masking process by using a half-tone mask or a slit mask (e.g., diffraction mask), so the array substrate can be fabricated by four masking process. This will be described in detail through the following fabrication method. Hereinafter, mentioning of the half-tone mask will also include the slit mask.

FIGS. 5A to 5D are sectional views sequentially showing the process of fabricating an array substrate for an LCD according to one embodiment of the present invention, in which the n− amorphous silicon thin film is formed together with the first and second amorphous silicon thin films through successive deposition.

Figure 5A:
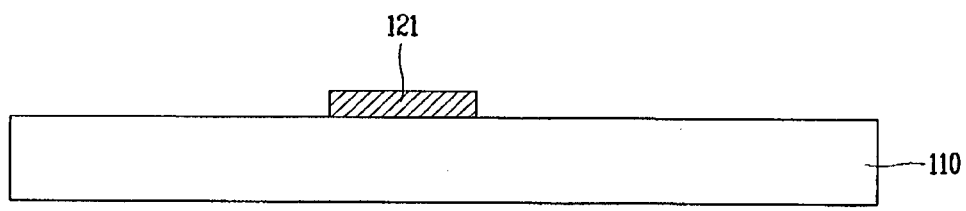
FIGS. 5A to 5D are sectional views sequentially showing the process of fabricating an array substrate for an LCD according to one embodiment of the present invention.

As shown in FIG. 5A, the gate electrode 121 and the gate line are formed at the pixel part of the array substrate 110 made of a transparent insulation material, such as glass. In this case, the gate electrode 121 and the gate line are formed by depositing a first conductive film on the entire surface of the array substrate 110 and selectively patterning it through a photolithography process (e.g., a first masking process). Here, the first conductive film may be made of a low-resistance opaque conductive material such as aluminum (Al), an aluminum alloy, tungsten (W), copper (Cu), chromium (Cr), molybdenum (Mo), or the like. Also, the first conductive film may be formed to have a multi-layered structure by stacking two or more low-resistance conductive materials.

Figure 5B:
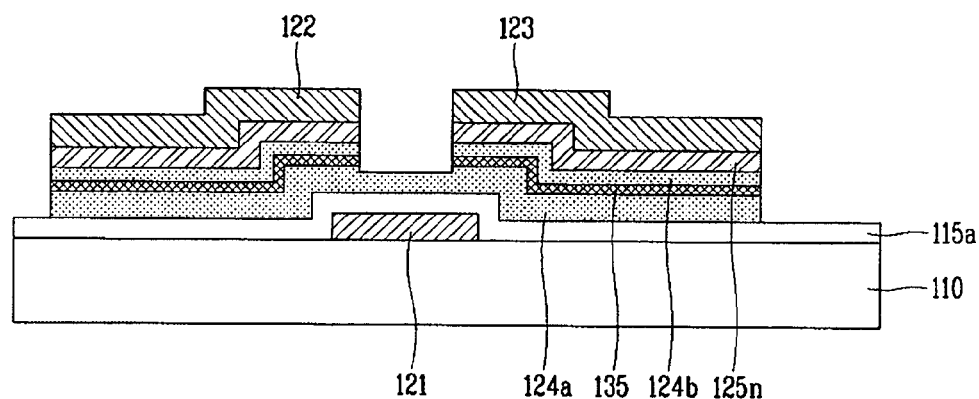

Next, as shown in FIG. 5B, the gate insulating layer 115a, an amorphous silicon thin film, an n+ amorphous silicon thin film, a barrier metal, and the first amorphous silicon thin film, the n− amorphous silicon thin film, the second amorphous silicon thin film, the n+ amorphous silicon thin film, and a second conductive film are on the entire surface of the array substrate 110 with the gate electrode 121 and the gate line formed thereon and then selectively removed through a photolithography process (e.g., a second masking process) to form the first active layer 124a formed of the first amorphous silicon thin film, the n− layer 135 formed on the n− amorphous silicon thin film, the second active layer 124b formed on the second amorphous silicon thin film, and the ohmic-contact layer 125n formed of the n+ amorphous silicon thin film at the pixel part of the array substrate 110. The source electrode 122 and the drain electrode 123 are formed of the second conductive film and electrically connected to a portion of the second active layer 124b through the ohmic-contact layer 125n. In this case, the first and second amorphous silicon thin films may be formed on the substantially same amorphous silicon, or may be formed of amorphous silicon of different conditions. In addition, through the second masking process, data lines (not shown) formed of the second conductive film and crossing the gate lines to define pixel areas are formed.

In the first embodiment of the present invention, on the first active layer 124a, there are sequentially formed the n− layer 135, the second active layer 124b, and the ohmic-contact layer 125n formed of the n− amorphous silicon thin film, the amorphous silicon thin film, and the n+ amorphous silicon thin film, respectively, which are patterned in the same shape as the source and drain electrodes 122 and 123. In this case, in the process of forming the first amorphous silicon thin film on the gate insulating layer 115a, $PH_3$ gas is additionally injected to successively form the n− amorphous silicon thin film. This is advantageous because there is no loss of tack time. Here, the first active layer 124a, the n− layer 135, the second active layer 124b, the ohmic-contact layer 125n, the source and drain electrodes 122 and 123, and the data line are simultaneously formed through a single masking process (e.g., the second masking process) by using the half-tone mask. The second masking process will now be described in detail with reference to the accompanying drawings.

FIGS. 6A to 6H are sectional views concretely showing a second masking process shown in FIG. 5B.

Figure 6A:
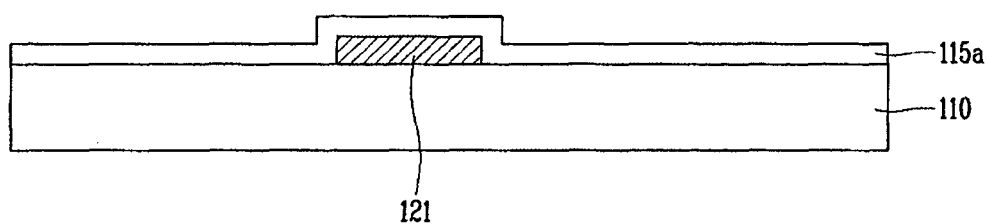
FIGS. 6A to 6H are sectional views showing a second masking process shown in FIG. 5B.
Figure 6B:
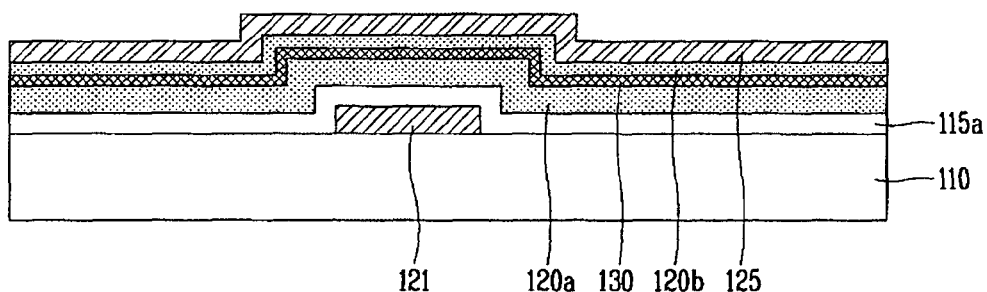

As shown in FIG. 6A, the gate insulating layer 115a formed of an insulation material such as a silicon nitride layer is formed on the entire surface of the array substrate 110 with the gate electrode 121 and the gate line formed thereon. Thereafter, as shown in FIG. 6B, the first amorphous silicon thin film 120a is formed with a thickness of about 600 Å to about 1600 Å by depositing the first amorphous silicon on the entire surface of the array substrate 110 with the gate insulating layer 115a formed thereon. Then, the n− amorphous silicon thin film 130 formed of the n− amorphous silicon is formed with a certain thickness (about 100 Å) on the first amorphous silicon thin film 120a. In this case, the n− amorphous silicon thin film 130 is formed by additionally injecting the $PH_3$ gas of a low density in the course of forming the first amorphous silicon thin film 120a. Processing conditions other than the injection of $PH_3$ gas may be controlled to be substantially the same, under which the n− amorphous silicon thin film 130 can be successively formed together with the first amorphous silicon thin film 120a.

Then, in a state that injection of the $PH_3$ gas is interrupted; the second amorphous silicon is continuously deposited to form the second amorphous silicon thin film 120b with a thickness of about 100 Å to about 300 Å on the n− amorphous silicon thin film 130. In this case, the thickness of the second amorphous silicon thin film 120b may vary depending on the thickness of the first amorphous silicon thin film 120a deposited on the entire surface of the array substrate 110, the ratio of the thickness of the second amorphous silicon thin film 120b to that of the first amorphous silicon thin film 120a being approximately between 1:4 and 1:17.

The n+ amorphous silicon thin film 125 formed of the n+ amorphous silicon is formed with a certain thickness (about 300 Å) on the second amorphous silicon thin film 120b in the same manner. In this case, the n+ amorphous silicon thin film 125 is formed by additionally injecting PH3 gas in the course of forming the second amorphous silicon thin film 120b. In this manner, the processing conditions other than the injection of $PH_3$ gas may be controlled to be substantially the same, under which the n+ amorphous silicon thin film 125 can be successively formed together with the first amorphous silicon thin film 120a, the n− amorphous silicon thin film 130, and the second amorphous silicon thin film 120b, thereby generating no loss of tack time.

Figure 6C:
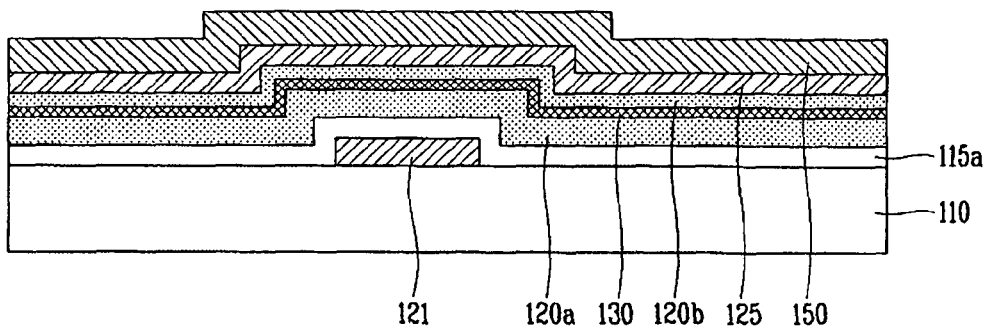

Next, as shown in FIG. 6C, the second conductive film 150 is formed on the entire surface of the array substrate 110 with the first amorphous silicon thin film 120a, the n− amorphous silicon thin film 130, the second amorphous silicon thin film 120b, and the n+ amorphous silicon thin film 125 formed thereon. In this case, the second conductive film 150 may be made of a low-resistance opaque conductive material such as aluminum (Al), an aluminum alloy, tungsten (W), copper (Cu), chromium (Cr), molybdenum (Mo), or the like to form the source electrode, the drain electrode, and the data line.

Figure 6D:
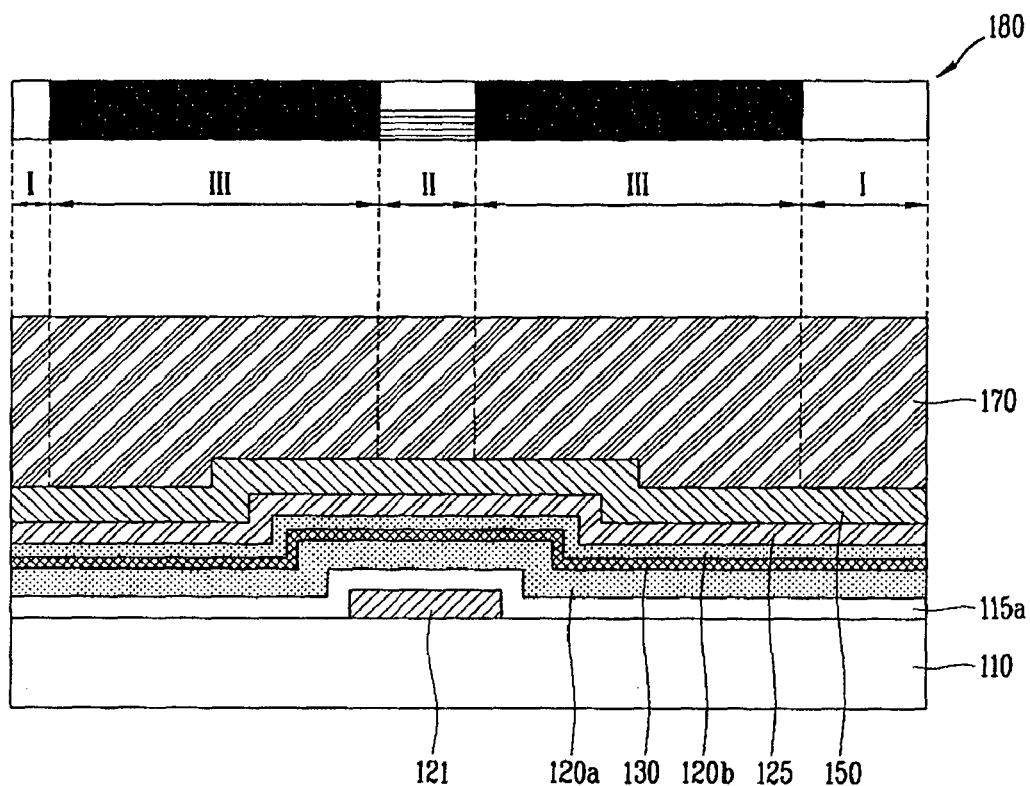

As shown in FIG. 6D, a photosensitive film 170 made of a photosensitive material such as photoresist is formed on the entire surface of the array substrate 110, to which light is selectively irradiated through a half-tone mask 180. The half-tone mask 180 includes a first transmission region (I) that allows irradiated light to be entirely transmitted therethrough, a second transmission region (II) that allows only some light to be transmitted therethrough while blocking the remaining light, and a blocking region (III) that entirely blocks the irradiated light. Only light which has been transmitted through the half-tone mask 180 is irradiated on the photosensitive film 170.

Figure 6E:
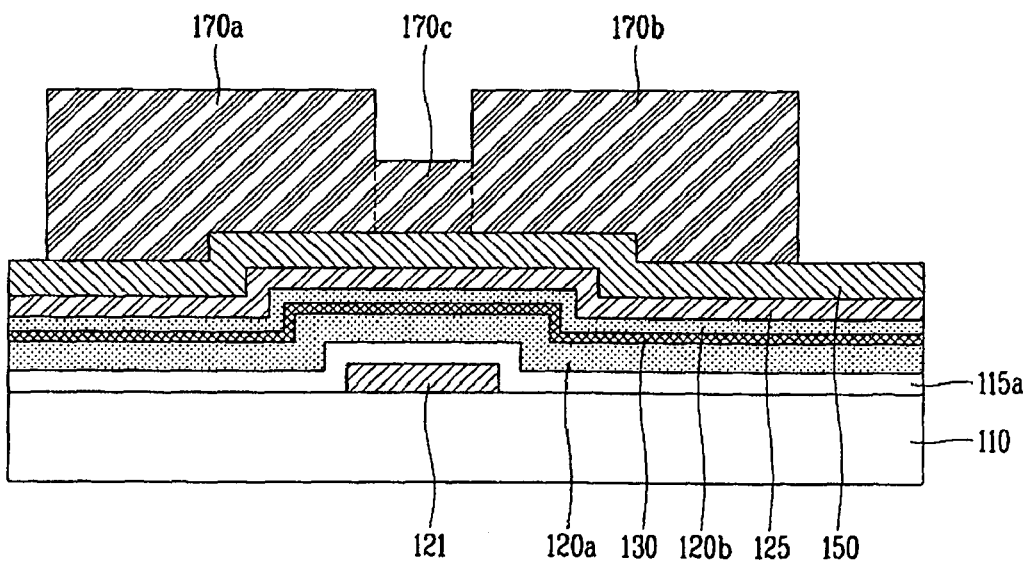

Subsequently, when the photosensitive film 170, which has been exposed through the half-tone mask 180 is developed, as shown in FIG. 6E, the first to third photosensitive film patterns 170a to 170c remain at regions where light has been entirely blocked or partially blocked through the blocking region (III) and the second transmission region (II), and the photosensitive film at the transmission region (I) through which light had been entirely transmitted has been completely removed to expose the surface of the second conductive film 150.

At this time, the first and second photosensitive film patterns 170a and 170b formed in the blocking region III are thicker than the third photosensitive film pattern 170c formed in the second transmission region II. In addition, the photosensitive film in the region where the light had entirely transmitted through the first transmission region I has been completely removed. This is because positive photoresist has been used. However, negative photoresist can be also used without departing from the present invention.

Figure 6F:
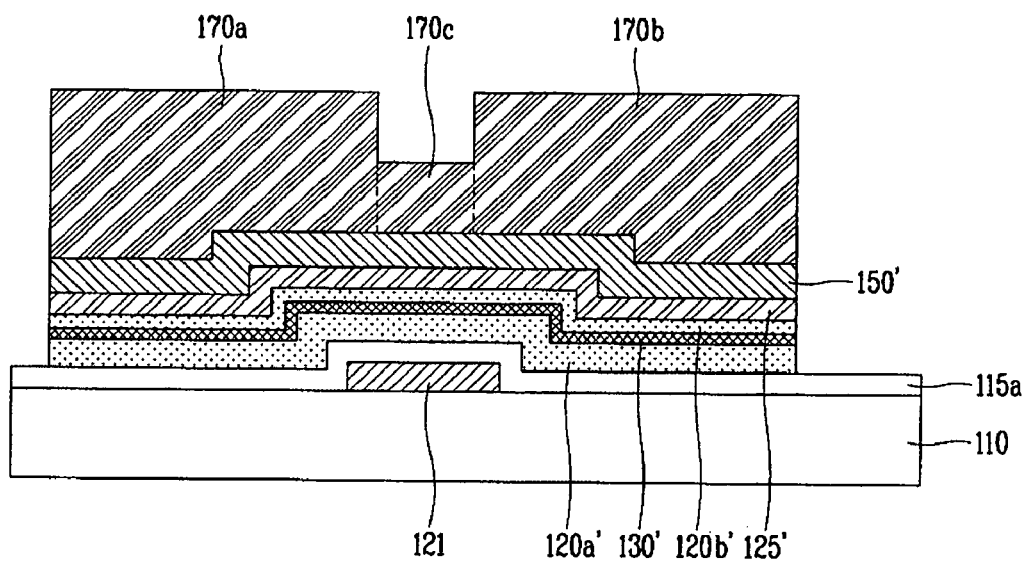

Then, as shown in FIG. 6F, the lower first amorphous silicon thin film, the n– amorphous silicon thin film, the second amorphous silicon thin film, the n+ amorphous silicon thin film and the second conductive layer are selectively removed by using the first to third photosensitive film patterns 170a to 170c to form a first amorphous silicon thin film pattern 120a', an n– amorphous silicon thin film pattern 130', a second amorphous silicon thin film pattern 120b', an n+ amorphous silicon thin film pattern 125' and a second conductive film pattern 150' at the pixel part of the array substrate 110. At this time, a data line (not shown) formed of the second conductive film and substantially crossing the gate line to define the pixel area is formed at the data line part of the array substrate 110.

Figure 6G:
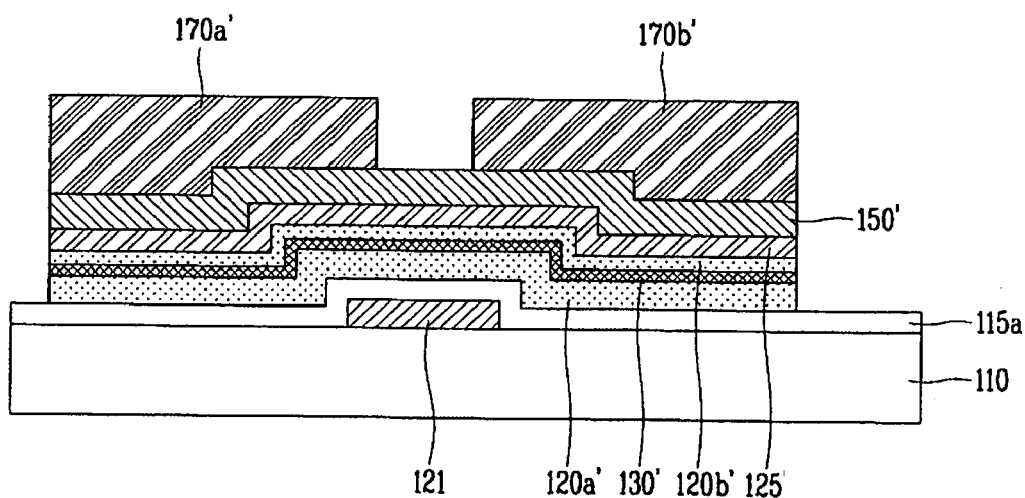

Thereafter, an ashing process is performed to partially remove the first to third photosensitive film patterns 170a to 170c. Then, as shown in FIG. 6G, the third photosensitive film pattern at the second transmission region II is completely removed. In this case, the first and second photosensitive film patterns remain as fourth and fifth photosensitive film patterns 170a' and 170b' by removing the thickness of the third photosensitive film pattern only at source and drain electrode regions corresponding to the blocking region III.

Figure 6H:
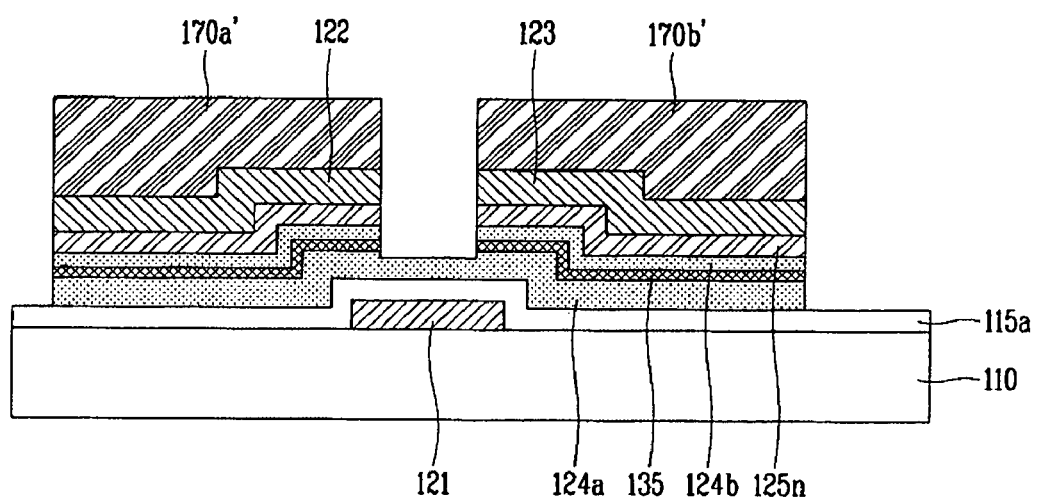

Thereafter, as shown in FIG. 6H, portions of the first amorphous silicon thin film pattern, the n– amorphous silicon thin film pattern, the second amorphous silicon thin film pattern, the n+ amorphous silicon thin film pattern and the second conductive pattern are selectively removed by using the remaining fourth and fifth photosensitive film patterns 170a' and 170b' to form the first active layer 124a, the n– layer 135, the second active layer 124b, and the ohmic-contact layer 125n which are respectively formed of the first amorphous silicon thin film, the n– amorphous silicon thin film, the second amorphous silicon thin film, and the n+ amorphous silicon thin film at the pixel part of the array substrate 110. In addition, the source electrode 122 and the drain electrode 123, which are formed on the second conductive film and electrically connected with a portion of the second active layer 124b, are formed. In this manner, in the first embodiment of the present invention, the first active layer 124a, the n– layer 135, the second active layer 124b, the ohmic-contact layer 125n, the source and drain electrodes 122 and 123, and the data line can be formed through a single masking process by using the half-tone mask.

Figure 5C:
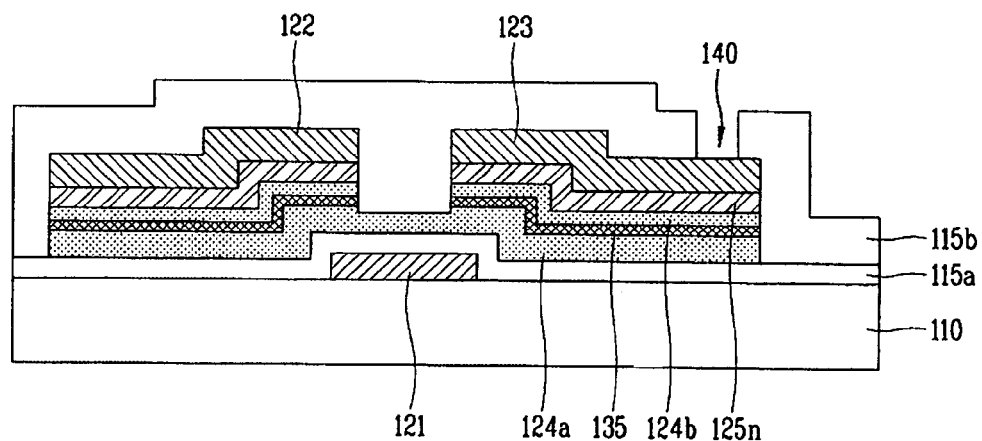
Figure 5D:
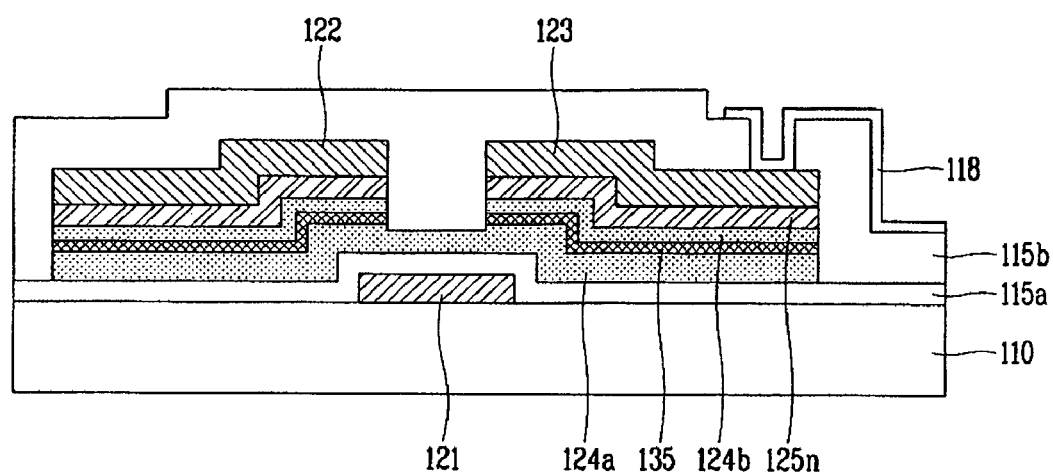

Next, as shown in FIG. 5C, a passivation layer 115b made of an insulation material is formed on the entire surface of the array substrate 110, and then a portion of the passivation layer 115b is selectively removed by using a photolithography process (e.g., a third masking process) to form a contact hole 140 exposing a portion of the drain electrode 123. Then, as shown in FIG. 5D, a third conductive film is formed on the entire surface of the array substrate 110 and then selectively patterned by using a photolithography process (e.g., a fourth masking process) to form the pixel electrode 118 electrically connected with the drain electrode 123 via the contact hole 140.

The resulting array substrate is attached in a facing manner with a color filter substrate by a sealant formed on edges of the image display region. On the color filter substrates, there are formed black matrixes preventing light leakage to the TFTs, gate lines, and data lines, as well as color filters implementing red, green and blue colors. The attachment of the color filter substrates and the array substrate is made by an attachment key formed on the color filter substrate or the array substrate.

Figure 7:
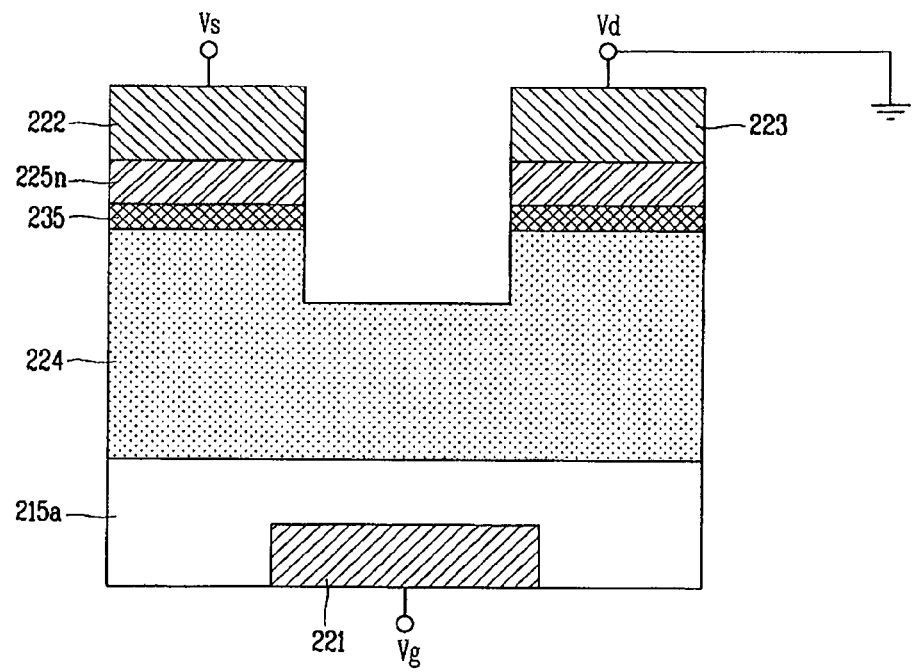
FIG. 7 is a sectional view schematically showing the structure of a TFT according to a second embodiment of the present invention.

FIG. 7 is a sectional view schematically showing the structure of a TFT according to a second embodiment of the present invention, in which the n– layer is formed immediately under the ohmic-contact layer. As shown in FIG. 7, the TFT according to the second embodiment of the present invention is formed such that, on a gate electrode 221, there are sequentially formed an active layer 224 formed of an amorphous silicon thin film with a gate insulating layer 215a interposed therebetween, an n– layer 235 formed of an n– amorphous silicon thin film, and an ohmic-contact layer 225n formed of an n+ amorphous silicon thin film. A source electrode 222 and a drain electrode 223 are formed on the ohmic-contact layer 225n and ohmic-contact with the active layer 224 is achieved via the ohmic-contact layer 225n.

In the second embodiment of the present invention, the n– layer 235 is positioned immediately under the ohmic-contact layer 225n, and when etching is performed to form a channel layer, the active layer 224 is etched up to a certain thickness. Because the local n– layer 235 is formed between the active layer 224 and the ohmic-contact layer 225n, a serial resistance between the source and drain electrodes 222 and 223 and the channel layer can be reduced to increase conductivity. As a result, ON current and charge mobility can be improved and the electrical characteristics of the TFT can be enhanced.

As mentioned above, in the second embodiment of the present invention, the n– layer 235 is formed by injecting $PH_3$ gas to a region immediately under the ohmic-contact layer 225. In this case, the n– layer 235 may be formed together with the active layer 224 through a successive deposition, or after the active layer 224 is formed, the n– layer 235 may be formed by performing additional $PH_3$ plasma processing. In this case, formation of the n– layer 235 by successively depositing $PH_3$ is advantageous because there is no tack time loss.

Figure 8:
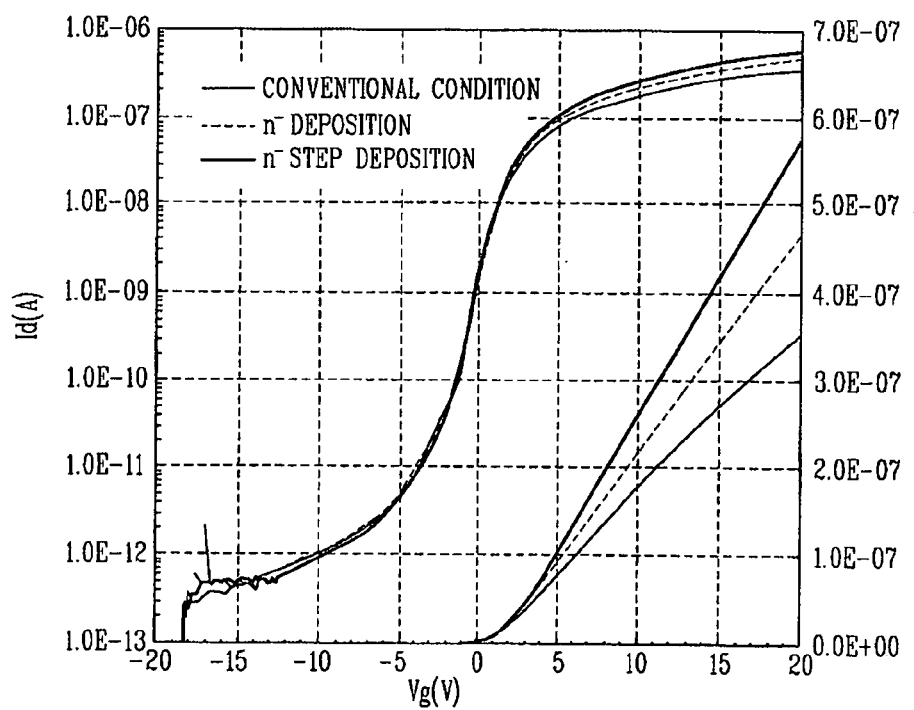
FIG. 8 is a graph showing electric characteristics of the TFT fabricated according to the first and second embodiments of the present invention.

FIG. 8 is a graph showing electric characteristics of the TFT fabricated according to the first and second embodiments of the present invention. The graph of FIG. 8 shows drain current according to gate voltages when the drain voltage is 1V. Specifically, FIG. 8 shows basic conditions in which an n– layer is not formed, a case where the n– layer is step-deposited in the active layer according to the first embodiment of the present invention, and a case where the n– layer is deposited immediately under the ohmic-contact layer according to the second embodiment of the present invention.

As shown in FIG. 8, it is noted that, in case of the n-deposition and n-step deposition, their ON current is higher than that in the basic conditions, and the ON current in the n-step deposition is highest. This is because the conductivity between the channel of the active layer and the ohmic-contact layer is increased owing to the reduction in the resistance of the vertical portion in the active layer. In addition, the charge mobility of the linear region is measured to have been increased in the case of n-deposition and n-step deposition compared with the basic conditions. Thus, it can be noted that the electrical characteristics of the TFT is good.

FIGS. 9A to 9G are sectional views sequentially showing a fabrication process of an array substrate for an LCD according to another embodiment of the present invention, in which a first amorphous silicon thin film is formed and then subjected to additional $PH_3$ plasma processing to form an n− amorphous silicon thin film.

Figure 9A:
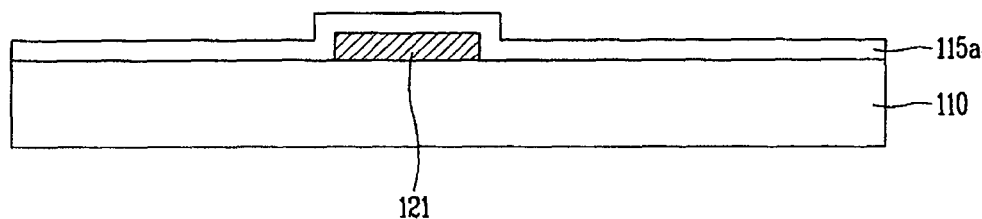
FIGS. 9A to 9G are sectional views sequentially showing a fabrication process of an array substrate for an LCD according to another embodiment of the present invention.

As shown in FIG. 9A, the gate electrode 121 and the gate line (not shown) are formed at the pixel part of the array substrate 110 made of a transparent insulation material, such as glass. In this case, the gate electrode 121 and the gate line are formed by depositing a first conductive film on the entire surface of the array substrate 110 and selectively patterning it through a photolithography process (e.g., a first masking process).

Figure 9B:
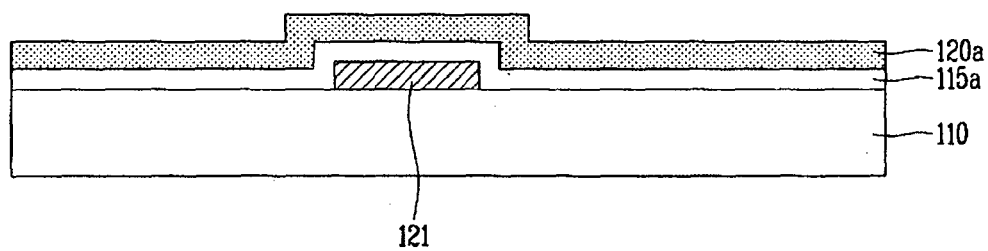

Then, as shown in FIG. 9B, the gate insulating layer 115a is formed on the entire surface of the array substrate 110 with the gate electrode 121 and the gate line formed thereon, and then a first amorphous silicon is deposited on the entire surface of the array substrate 110 with the gate insulating layer 115a formed thereon to form the first amorphous silicon thin film 120a.

Figure 9C:
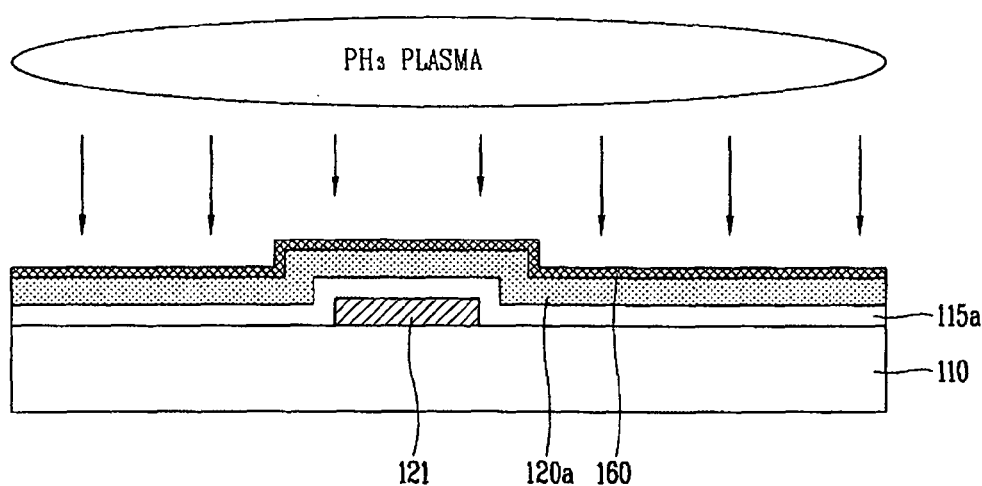
Figure 9D:
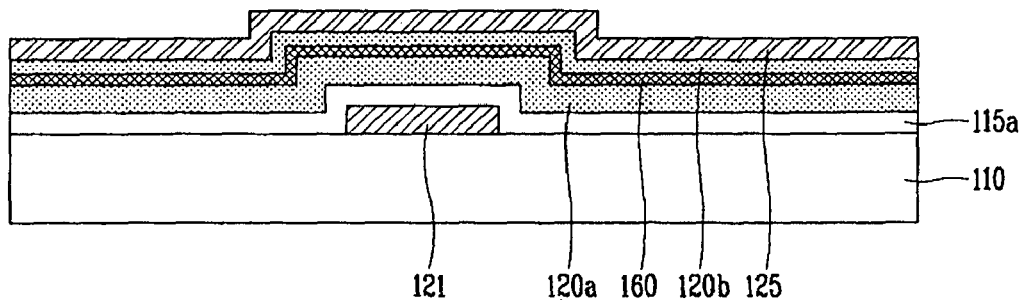

Thereafter, as shown in FIG. 9C, $PH_3$ plasma processing is performed on the entire surface of the array substrate 110 to form the n− amorphous silicon thin film 160. After the n− amorphous silicon thin film 160 is formed, as shown in FIG. 9D, the second amorphous silicon and the n+ amorphous silicon are deposited on the entire surface of the array substrate 110 to form the second amorphous silicon thin film 120b and the n+ amorphous silicon thin film 125 with a certain thickness.

Figure 9E:
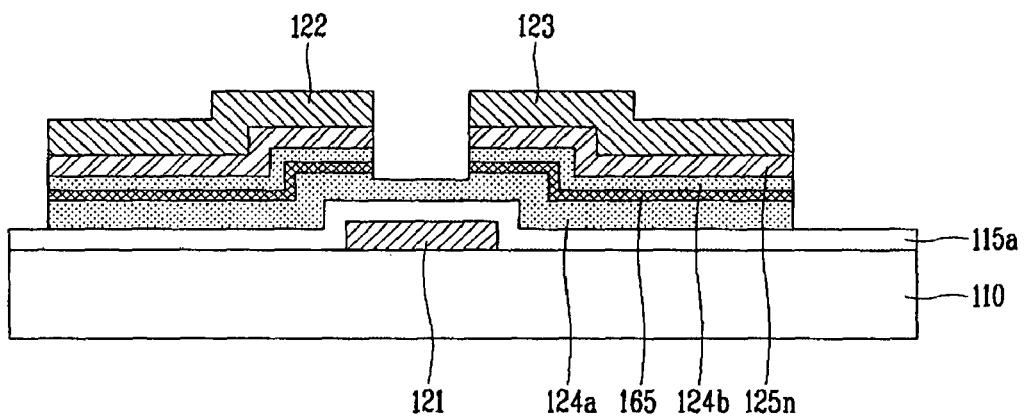

Subsequently, as shown in FIG. 9E, the second conductive film is formed on the entire surface of the array substrate 110 with the first amorphous silicon thin film 120a, the n− amorphous silicon thin film 160, the second amorphous silicon thin film 120b, and the n+ amorphous silicon thin film 125 formed thereon, and then selectively patterned through a photolithography process (e.g., a second masking process) to form the first active layer 124a, the n− layer 165, the second active layer 124b, and the ohmic-contact layer 125n at the pixel part of the array substrate 110. In addition, the source electrode 122 and the drain electrode 123 are formed of the second conductive film and electrically connected with a portion of the second active layer 124b.

Figure 9F:
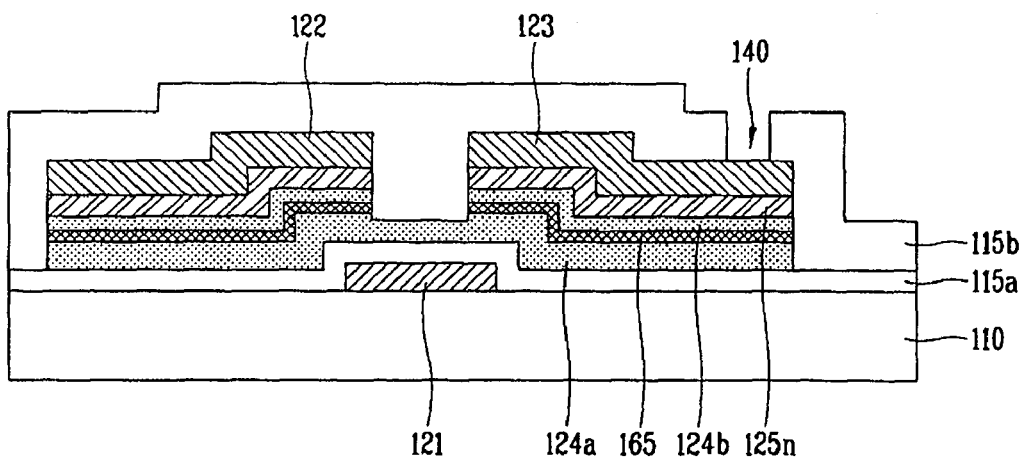
Figure 9G:
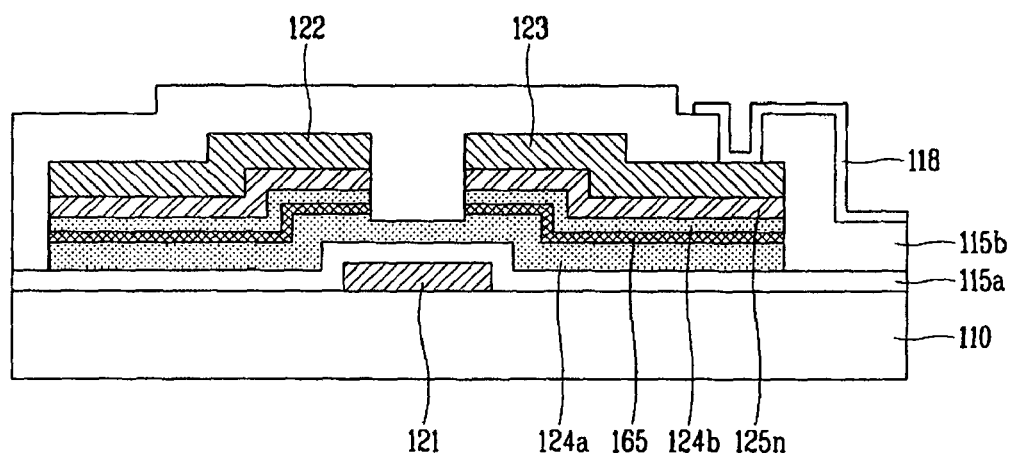

Thereafter, as shown in FIG. 9F, the passivation layer 115b made of an insulation material is formed on the entire surface of the array substrate 110, and then a portion of the passivation layer 115b is selectively removed by using a photolithography process (e.g., a third masking process) to form a contact hole 140 exposing a portion of the drain electrode 123. Then, as shown in FIG. 9G, the third conductive film is formed on the entire surface of the array substrate 110 and then selectively patterned by using a photolithography process (e.g., a fourth masking process) to form the pixel electrode 118 electrically connected with the drain electrode 123 via the contact hole 140.

Figure 10:
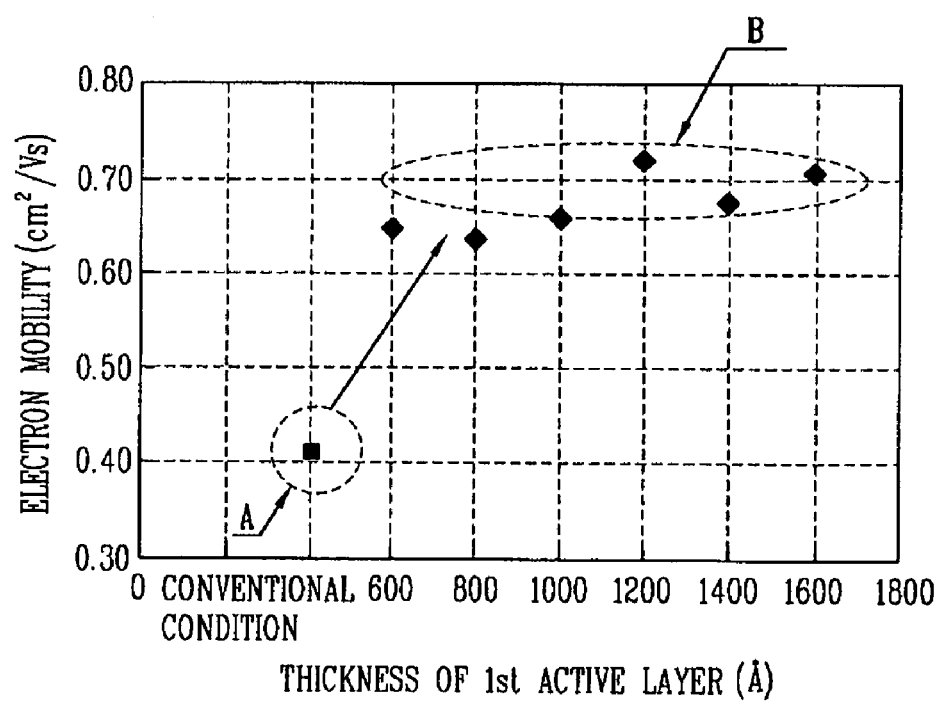
FIG. 10 is a graph showing a charge mobility according to the thickness of a first active layer.

FIG. 10 is a graph showing charge mobility according to the thickness of a first active layer. The portion "A" indicates electron mobility in the channel of the general TFT under the basic conditions, and the portion "B" indicates electron mobility according to positions (600 Å~1600 Å) where the n− layer is formed in the TFT according to the present invention. As shown in FIG. 10, the TFT according to the present invention has improved electron mobility (~0.68 $cm^2$/Vs) that is 50%~60% higher than the electron mobility of the general TFT (~0.42 $cm^2$/Vs). In particular, it is noted that when the n− layer is positioned within the range of 1200 Å~1600 Å, the TFT has the best charge mobility (~0.7 $cm^2$/Vs).

In the present invention, by interposing the n− layer between the first and second active layers, a charging time can be improved according to the improvement of the charge mobility. Thus, the RF driving can be implemented.

Figure 11A:
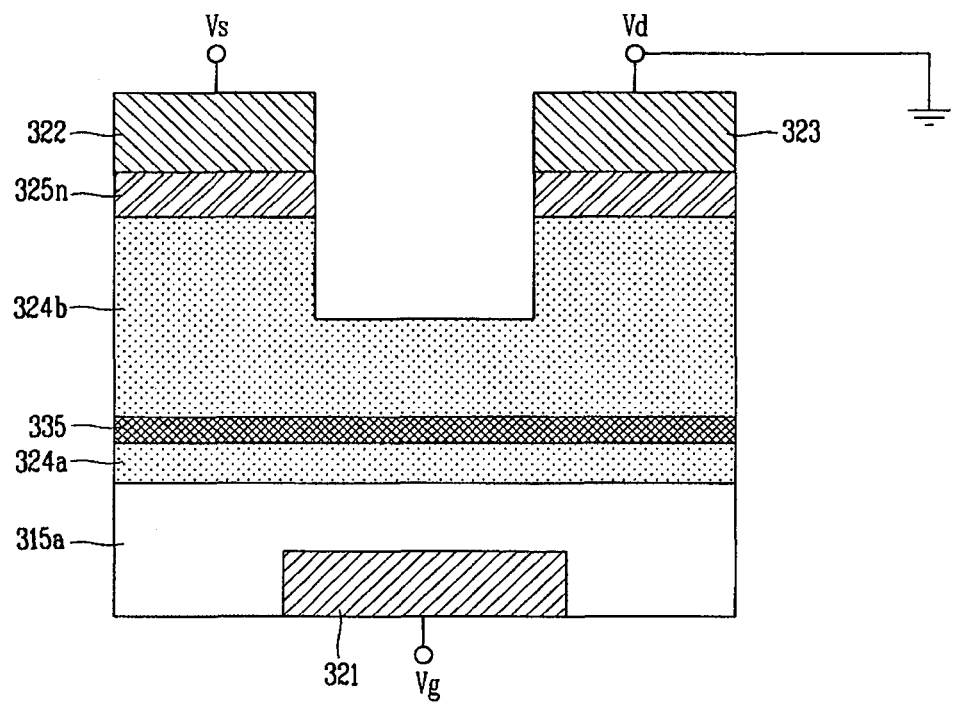
FIGS. 11A and 11B are sectional views schematically showing the structure of a TFT according to third and fourth embodiments of the present invention.
Figure 11B:
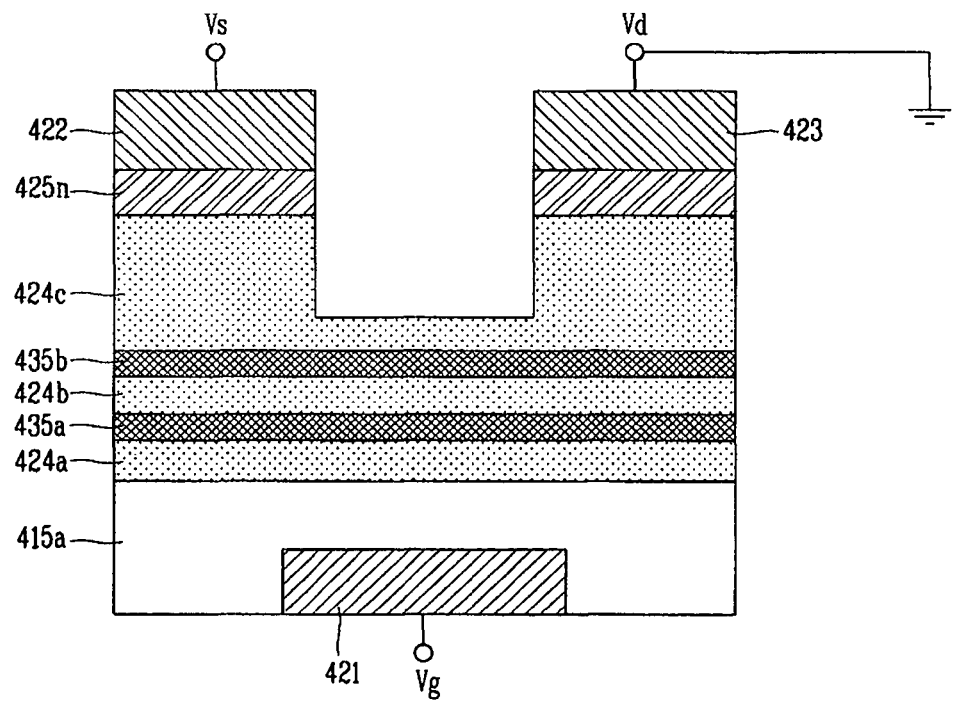

FIGS. 11A and 11B are sectional views schematically showing the structure of a TFT according to third and fourth embodiments of the present invention, in which etching is performed up to a portion of the thickness of the second active layer.

As shown in FIG. 11A, the TFT according to the third embodiment of the present invention is formed such that, on a gate electrode 321, there are sequentially formed a first active layer 324a formed of a first amorphous silicon thin film with a gate insulating layer 315a interposed therebetween, an n− layer 335 formed of an n-amorphous silicon thin film, a second active layer 324b formed of a second amorphous silicon thin film, and an ohmic-contact layer 325n formed of an n+ amorphous silicon thin film. A source electrode 322 and a drain electrode 323 are formed on the ohmic-contact layer 325n and ohmic-contact with the second active layer 324b is achieved via the ohmic-contact layer 325n. The n− layer 335 according to the third embodiment of the present invention is positioned between the first and second active layers 324a and 324b, and when etching is performed to form a channel layer, the second active layer 324b is etched up to a certain thickness.

In the third embodiment of the present invention, the first amorphous silicon is deposited with about 300 Å to about 400 Å to form the first amorphous silicon thin film, which is then subjected to plasma processing to dope P element on the surface of the first amorphous silicon thin film. Next, the second amorphous silicon and the n+ amorphous silicon are deposited to form the second amorphous silicon thin film and the n+ amorphous silicon thin film.

The following processes are the same as those described above, and because the P element doped on the surface of the first amorphous silicon thin film through the $PH_3$ plasma processing is a 5-group element having one more electron than silicon (Si), the surplus electrons effect the operation of the TFT. Namely, because the number of electron carriers increases compared with the existing structure, the threshold voltage Vth has a negative value. In this case, the $PH_3$ plasma processing time may be adjusted to control the Vth movement degree, and if this is applied to a driving TFT of an OLED (organic light emitting diode) and a TFT of high duty ratio, life span can be lengthened.

When the $PH_3$ plasma processing is performed one time like in the third embodiment of the present invention, the quantity of flow of $PH_3$ can be increased, and even if the plasma processing time is lengthened, the threshold voltage Vth does not move any more and is saturated. Thus, unlike the third embodiment of the present invention, the $PH_3$ plasma processing may be performed several times in the middle of depositing the amorphous silicon thin film to increase the movement degree of the threshold voltage Vth. This will be explained through the fourth embodiment of the present invention as shown in FIG. 11B.

As shown in FIG. 11B, a TFT according to the fourth embodiment of the present invention is formed such that, on a gate electrode 421, there are sequentially formed a first active layer 424a formed of a first amorphous silicon thin film with a gate insulating layer 415a interposed therebetween, a first n– layer 435a formed of a first n-amorphous silicon thin film, a second active layer 424b formed of a second amorphous silicon thin film, a second n– layer 435b formed of a second n– amorphous silicon thin film, a third active layer 424c formed of a third amorphous silicon thin film, and an ohmic-contact layer 425n formed of an n+ amorphous silicon thin film. A source electrode 422 and a drain electrode 423 are formed on the ohmic-contact layer 425n and ohmic-contact with the third active layer 424 is achieved via the ohmic-contact layer 425n.

The n– layer according to the fourth embodiment of the present invention includes the first n– layer 435a positioned between the first and second active layers 424a and 424b and the second n– layer 435b positioned between the second and third active layers 424b and 424c. When etching is performed to form a channel layer, the third active layer 424c is etched up to a certain thickness. But the present invention is not limited thereto, and the PH$_3$ plasma processing may be performed three or more times while the amorphous silicon thin film is being deposited. Compared with the third embodiment of the present invention, in the fourth embodiment of the present invention, the number of electron carriers is increased, so the movement degree of the threshold voltage Vth can be increased.

The present invention can be applicable for any other display devices fabricated by using the TFTs, such as an OLED, in which an organic electroluminescence device is connected to a driving transistor.

It will be apparent to those skilled in the art that various modifications and variations can be made in the array substrate of liquid crystal display and a method for fabricating the same of the present invention without departing from the spirit or scope of the invention. Thus, it is intended that the present invention cover the modifications and variations of this invention provided they come within the scope of the appended claims and their equivalents.

What is claimed is:

1. A thin film transistor (TFT) for a liquid crystal display device, comprising:
    a gate electrode;
    a source electrode;
    a drain electrode;
    an active region including a first semiconductor layer, a third semiconductor layer and a second semiconductor layer interposed between the first semiconductor layer and the third semiconductor layer; and
    an ohmic contact layer formed on the third semiconductor layer of the active region,
    wherein the first semiconductor layer and the third semiconductor layer are formed of an amorphous silicon thin film, and the second semiconductor layer is formed of an n– amorphous silicon thin film, and
    wherein the source and drain electrodes are formed on the ohmic contact layer.

2. The thin film transistor of claim 1, wherein the TFT includes an etched portion formed in the active region.

3. The thin film transistor of claim 2, wherein the second semiconductor layer is separated by the etched portion.

4. The thin film transistor of claim 2, wherein the second semiconductor layer is formed below the etched portion.

5. The thin film transistor of claim 1 further comprising a fourth semiconductor layer interposed between the third semiconductor layer and the second semiconductor layer.

6. The thin film transistor of claim 1, wherein the first semiconductor layer below the second semiconductor layer is about 100 Å to about 300 Å.

7. The thin film transistor of claim 1, wherein a ration of thickness of the first semiconductor layer below the second semiconductor layer to that of the third semiconductor layer above the second semiconductor layer is about 1:4 to about 1:17.

8. The thin film transistor of claim 1, wherein the second semiconductor layer is about or less than 100 Å.

9. The thin film transistor of claim 5, wherein the fourth semiconductor layer is an n– amorphous silicon.

10. A thin film transistor (TFT) for a liquid crystal display device, comprising:
    a gate electrode;
    a gate insulating layer over the gate electrode;
    a first semiconductor layer formed on the gate insulating layer;
    a second semiconductor layer formed on the first semiconductor layer;
    a third semiconductor layer formed on the second semiconductor layer,
    wherein the first semiconductor layer and the third semiconductor layer are formed of an amorphous silicon thin film, and the second semiconductor layer is formed of an n– amorphous silicon thin film;
    an etched portion formed in the first, third and second semiconductor layers;
    an ohmic contact layer formed on the third semiconductor layer; and
    source and drain electrodes formed on the ohmic contact layer.

11. The thin film transistor of claim 10, wherein the second semiconductor layer is about or less than 100 Å.

* * * * *